(12) United States Patent
Yu et al.

(10) Patent No.: US 6,853,020 B1
(45) Date of Patent: Feb. 8, 2005

(54) DOUBLE-GATE SEMICONDUCTOR DEVICE

(75) Inventors: Bin Yu, Cupertino, CA (US); Judy Xilin An, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 149 days.

(21) Appl. No.: 10/290,330

(22) Filed: Nov. 8, 2002

(51) Int. Cl.$^7$ ............................................. H01L 29/80
(52) U.S. Cl. ...................... 257/270; 257/250; 257/328; 257/347; 257/388; 257/407; 257/412; 257/900; 438/193; 438/195; 438/284
(58) Field of Search ................................ 257/336, 388, 257/407, 412, 413, 507, 347–354, 900, 377, 382–384, 454–456, 486, 576, 587, 751, 754–757, 768–770

(56) References Cited

U.S. PATENT DOCUMENTS

| 5,315,143 | A | | 5/1994 | Tsuji ........................... 257/351 |
|---|---|---|---|---|
| 6,159,782 | A | * | 12/2000 | Xiang et al. ................. 438/197 |
| 6,300,182 | B1 | * | 10/2001 | Yu .............................. 438/217 |
| 6,396,108 | B1 | | 5/2002 | Krivokapic et al. ......... 257/365 |
| 6,458,662 | B1 | * | 10/2002 | Yu .............................. 438/286 |
| 6,483,171 | B1 | | 11/2002 | Forbes et al. ................ 257/627 |
| 6,525,403 | B2 | | 2/2003 | Inaba et al. .................. 257/618 |
| 6,528,381 | B2 | * | 3/2003 | Lee et al. ..................... 438/373 |
| 6,610,576 | B2 | * | 8/2003 | Nowak ......................... 438/301 |
| 2003/0042531 | A1 | | 3/2003 | Lee et al. |
| 2003/0113970 | A1 | | 6/2003 | Fried et al. |
| 2003/0151077 | A1 | * | 8/2003 | Mathew et al. .............. 257/250 |

OTHER PUBLICATIONS

Digh Hisamoto et al., "FinFET–A Self–Aligned DoubleGate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.
Xuejue Huang et al., "Sub–50 nm P–Channel FinFET," IEEE Transactions on Electron Devices, vol. 48, No. 5, May 2001, pp. 880–886.
Xuejue Huang et al., "Sub 50–nm FinFET: PMOS," 1999 IEEE, IEDM, pp. 67–70.
Yang–Kyu Choi et al., "Nanoscale CMOS Spacer FinFET for the Terabit Era," IEEE Electron Device Letters, vol. 23, No. 1, Jan. 2002, pp. 25–27.
U.S. Appl. No. 10/348,758, filed Jan. 23, 2003; Judy Xilin An et al.; Germanium MOSFET Devices and Methods for Making same; 51 pages.
U.S. Appl. No. 10/290,158, filed Nov. 8, 2002; Shibly S. Ahmed et al.; Double Gate Semiconductor Device Having Separate Gates; 24 pages.
U.S. Appl. No. 10/602,061, filed Jun. 24, 2003, Shibly S. Ahmed et al., Double Gate Semiconductor Device Having Separate Gates; 24 pages.
U.S. Appl. No. 10/770,011; Bin Yu et al.; filed Feb. 3, 2004; entitled "Double–Gate Semiconductor Device with Gate Contacts Formed Adjacent Sidewalls of a Fin", 27 pages.

* cited by examiner

Primary Examiner—David Nelms
Assistant Examiner—Andy Huynh
(74) Attorney, Agent, or Firm—Harrity & Snyder LLP

(57) ABSTRACT

A double-gate semiconductor device includes a substrate, an insulating layer, a fin and two gates. The insulating layer is formed on the substrate and the fin is formed on the insulating layer. A first gate is formed on the insulating layer and is located on one side of the fin. A portion of the first gate includes conductive material doped with an n-type dopant. The second gate is formed on the insulating layer and is located on the opposite side of the fin as the first gate. A portion of the second gate includes conductive material doped with a p-type dopant.

12 Claims, 11 Drawing Sheets

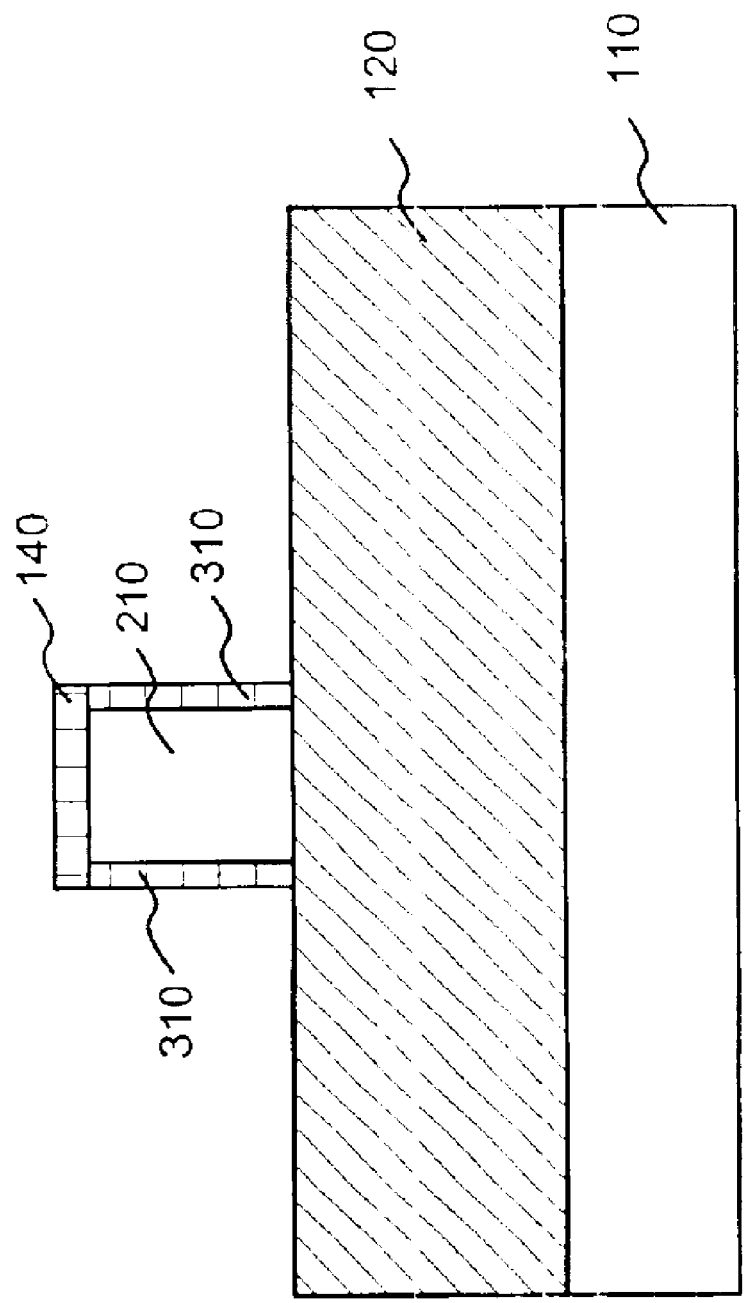

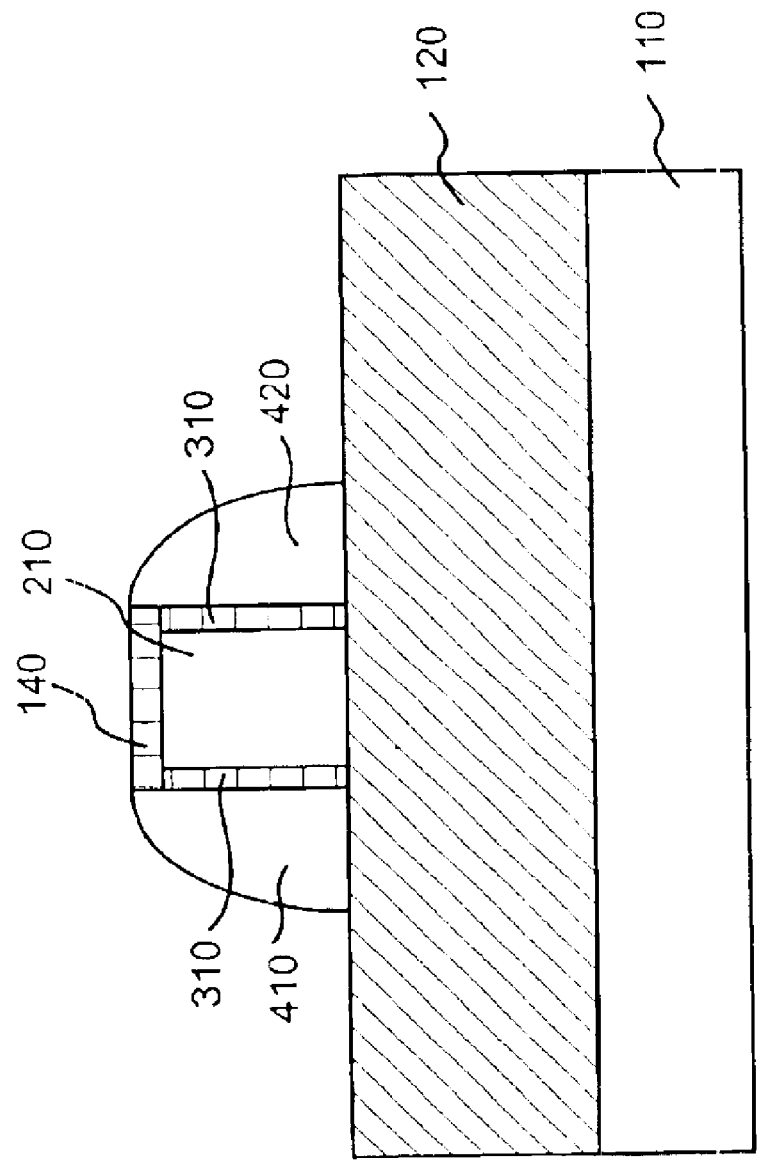

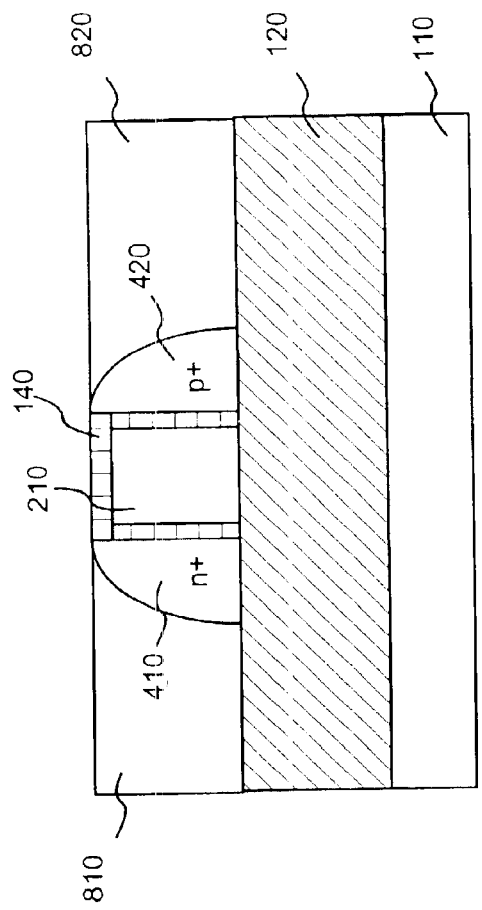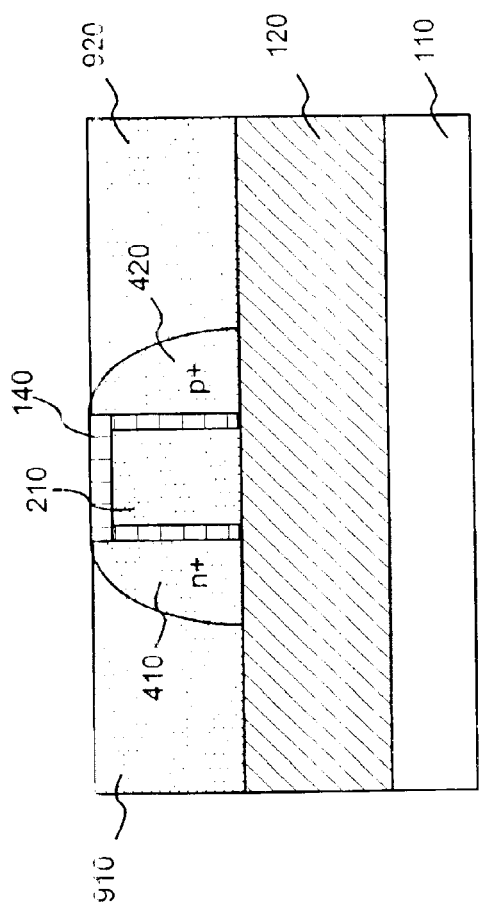

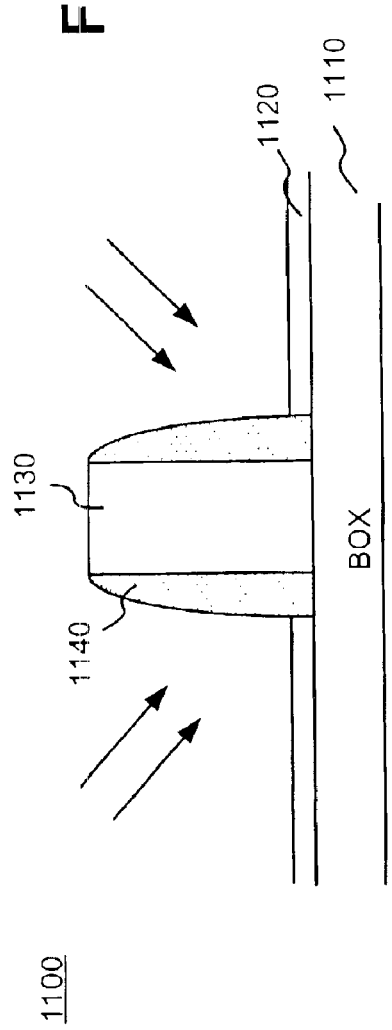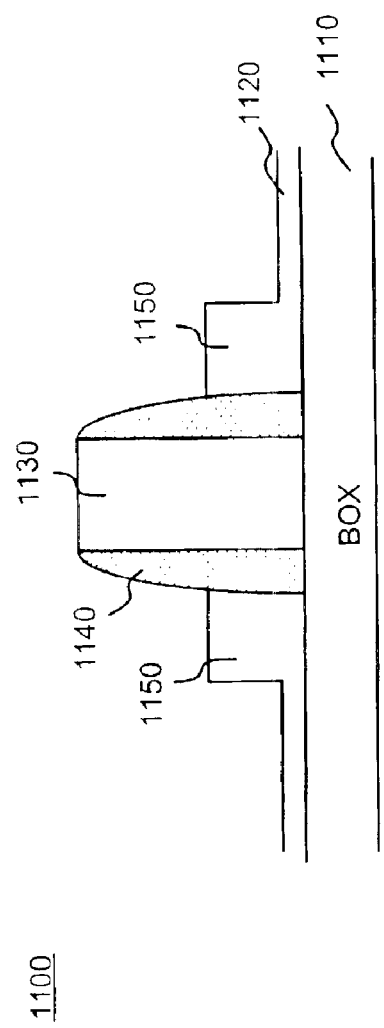

DOUBLE-GATE SEMICONDUCTOR DEVICE

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a FinFET device with two gates that are electrically separated from each other by a conductive fin. The two gates may be asymmetrically doped and may be fully silicided.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a semiconductor device that includes a substrate, an insulating layer, a fin, a first gate and a second gate. The insulating layer is formed on the substrate and the fin is formed on the insulating layer. The first gate is formed on the insulating layer and is disposed on a first side of the fin. The first gate includes a conductive material, where at least a portion of the first gate is doped with an n-type dopant. The second gate is formed on the insulating layer and is disposed on a second side of the fin opposite the first side. The second gate includes a conductive material, where at least a portion of the second gate is doped with a p-type dopant.

According to another aspect of the invention, a method of manufacturing a semiconductor device is provided. The method includes forming a fin on an insulating layer, where the fin includes first and second side surfaces, a top surface and a bottom surface. The method also includes forming a dielectric layer over the top surface of the fin, forming source and drain regions and forming first and second spacers adjacent the respective first and second side surfaces of the fin. The method further includes doping the first spacer with n-type impurities, doping the second spacer with p-type impurities and depositing a gate material over the fin and the first and second spacers. The method also includes planarizing the deposited gate material, patterning and etching the gate material to form a first gate and a second gate on opposite sides of the fin.

According to a further aspect of the invention, a semiconductor device that includes a substrate, an insulating layer, a conductive fin, a first gate and a second gate is provided. The insulating layer is formed on the substrate, the conductive fin is formed on the insulating layer and the gate dielectric formed on first and second side surfaces of the conductive fin. The first gate is formed on the insulating layer adjacent the gate dielectric formed on the first side surface of the fin, where at least a portion of the first gate includes an n-type doped conductive material. The second gate is formed on the insulating layer adjacent the gate dielectric formed on the second side surface of the fin, where at least a portion of the second gate includes a p-type doped conductive material.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 3 is a cross-section illustrating the formation of a gate dielectric layer on the fin of FIG. 2A in accordance with an exemplary embodiment of the present invention.

FIG. 4 is a cross-section illustrating the formation of spacers on the device of FIG. 3 in accordance with an exemplary embodiment of the present invention.

FIG. 8 is a cross-section illustrating the planarizing of the gate material in accordance with an exemplary embodiment of the present invention.

FIG. 9A is a cross-section illustrating the formation of silicided gate material in accordance with an exemplary embodiment of the present invention.

FIGS. 11A and 11B are cross-sections illustrating the formation of raised source/drain areas in accordance with another embodiment of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide double-gate FinFET devices and methods of manufacturing such devices. The FinFET devices may include one gate doped with an n-type dopant and a second gate doped with a p-type dopant.

Figure 1:
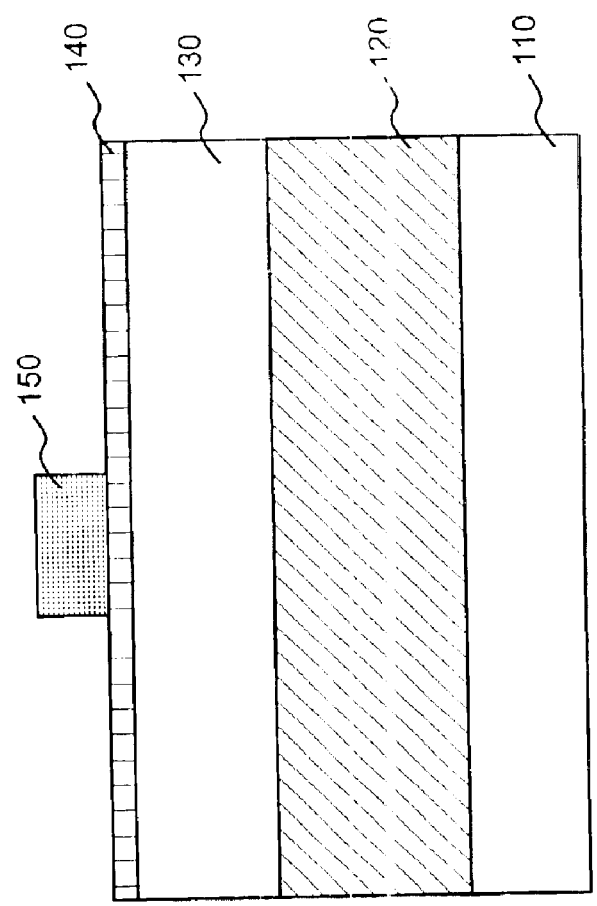
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide, such as $SiO_2$, and may have a thickness ranging from about 1500 Å to about 3000 Å. Silicon layer 130 may include monocrystalline or polycrystalline silicon having a thickness ranging from about 200 Å to about 1000 Å. Silicon layer 130 is used to form a fin for a FinFET transistor device, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

A dielectric layer 140, such as a silicon nitride layer or a silicon oxide layer, may be formed over silicon layer 130 to act as a protective cap during subsequent etching processes. In an exemplary implementation, dielectric layer 140 may be deposited at a thickness ranging from about 100 Å to about 250 Å. Next, a photoresist material may be deposited and patterned to form a photoresist mask 150 for subsequent processing. The photoresist may be deposited and patterned in any conventional manner.

Figure 2A:
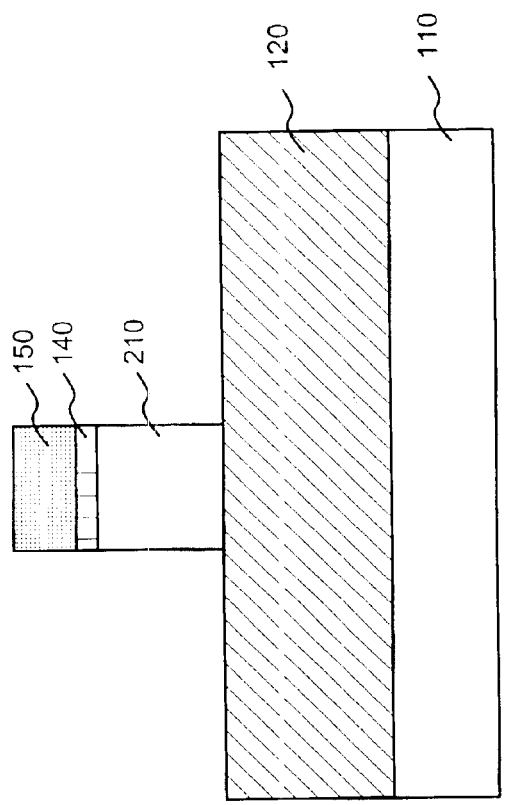
FIG. 2A is a cross-section illustrating the formation of a fin in accordance with an exemplary embodiment of the present invention.

Semiconductor device 100 may then be etched. In an exemplary implementation, silicon layer 130 and dielectric layer 140 may be etched in a conventional manner, with the etching terminating on buried oxide layer 120, as illustrated in FIG. 2A. Referring to FIG. 2A, dielectric layer 140 and silicon layer 130 have been etched to form a fin 210 comprising silicon with a dielectric cap 140.

Figure 2B:
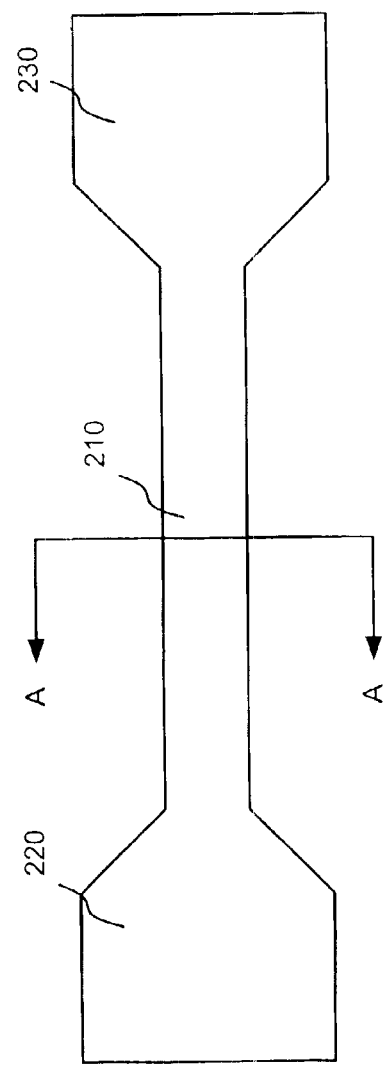
FIG. 2B schematically illustrates the top view of the semiconductor device of FIG. 2A in accordance with an exemplary embodiment of the present invention.

After the formation of fin 210, source and drain regions may be formed adjacent the respective ends of fin 210. For example, in an exemplary embodiment, a layer of silicon, germanium or combination of silicon and germanium may be deposited, patterned and etched in a conventional manner to form source and drain regions. FIG. 2B illustrates a top view of semiconductor 100 including source region 220 and drain region 230 formed adjacent fin 210 on buried oxide layer 120, according to an exemplary embodiment of the present invention.

The photoresist mask 150 may be removed and a dielectric layer may then be formed on fin 210. For example, a thin oxide film 310 maybe thermally grown on fin 210, as illustrated in FIG. 3. The cross-sectional view of FIG. 3 is taken along line AA in FIG. 2B. The oxide film 310 may be grown to a thickness of about 10 Å to about 30 Å and may be formed on the exposed silicon side surfaces of fin 210 to act as a gate dielectric layer. The dielectric cap 140, however, protects the top surface of fin 210.

A conductive layer, such as undoped polycrystalline silicon, may then be deposited over semiconductor device 100 and etched to form spacers 410 and 420 adjacent the gate dielectric 310 on the side surfaces of fin 210, as illustrated in FIG. 4. Alternatively, another conductive material, such as germanium or combinations of silicon and germanium may be used to form spacers 410 and 420. According to an exemplary implementation consistent with the present invention, the width of spacers 410 and 420 may range from about 200 Å to about 1000 Å. The spacers 410 and 420 may comprise a portion of the gate material for subsequently formed gates for semiconductor device 100.

Figure 5:
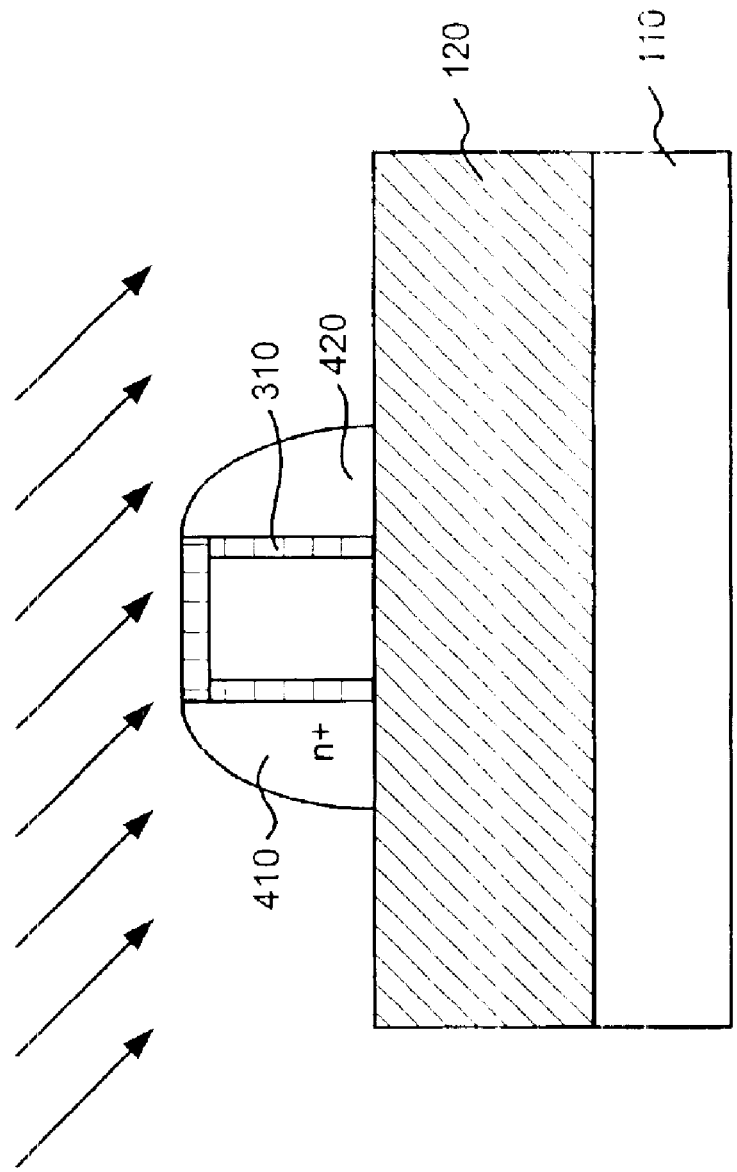
FIGS. 5 and 6 are cross-sections illustrating a tilt angle implant process on the device of FIG. 4 in accordance with an exemplary embodiment of the present invention.
Figure 6:
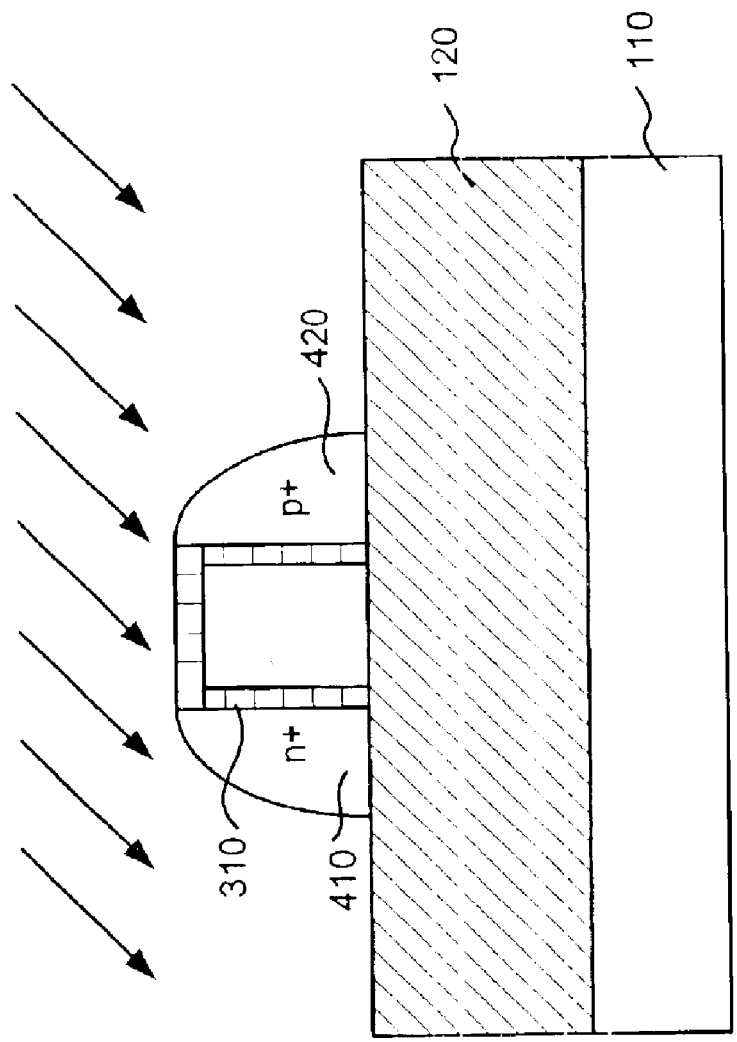

Spacers 410 and 420 may then be doped using a tilt angle implant process, as illustrated in FIGS. 5 and 6. For example, n-type impurities, such as arsenic or phosphorous, may be implanted at a dosage of about $1 \times 10^{14}$ atoms/cm$^2$ to about $1 \times 10^{15}$ atoms/cm$^2$ and an implantation energy of about 5 KeV to about 20 KeV. In addition, the implantation may be performed at a tilt angle of about 30 degrees to about 60 degrees to dope spacer 410, as illustrated in FIG. 5. The particular tilt angle may be selected such that only a small percentage of the n-type impurities, if any, will reach spacer 420 as the majority of spacer 420 will be shielded from the implantation by fin 210 and dielectric cap 140.

Next, p-type impurities, such as, for example, boron or $BF_2$, may be implanted at a dosage of about $1 \times 10^{14}$ atoms/cm$^2$ to about $1 \times 10^{15}$ atoms/cm$^2$ and an implantation energy of about 5 KeV to about 20 KeV. In addition, the implantation may be performed at a tilt angle of about 30 degrees to about 60 degrees to dope spacer 420, as illustrated in FIG. 6. Similar to the discussion above with respect to FIG. 5, the particular tilt angle may be selected such that only a small percentage of the p-type impurities, if any, reach spacer 410, as the majority of spacer 410 will be shielded from the implantation by fin 210 and dielectric cap 140.

After the tilt angle implant processes are complete, spacer 410 comprises silicon doped predominately with, or only with, n-type impurities and spacer 420 comprises silicon doped predominately with, or only with, p-type impurities. One of ordinary skill in the art will appreciate that the order of the implantations performed with respect to FIGS. 5 and 6 could be readily reversed. In addition, the particular implantation dosages, energies and tilt angles used to dope spacers 410 and 420 can be optimized based on the particular circuit requirements. For example, varying the dopant concentrations in each of spacers 410 and 420 may result in different work functions (Φ) for the gates that will be formed, as described in more detail below.

Figure 7:
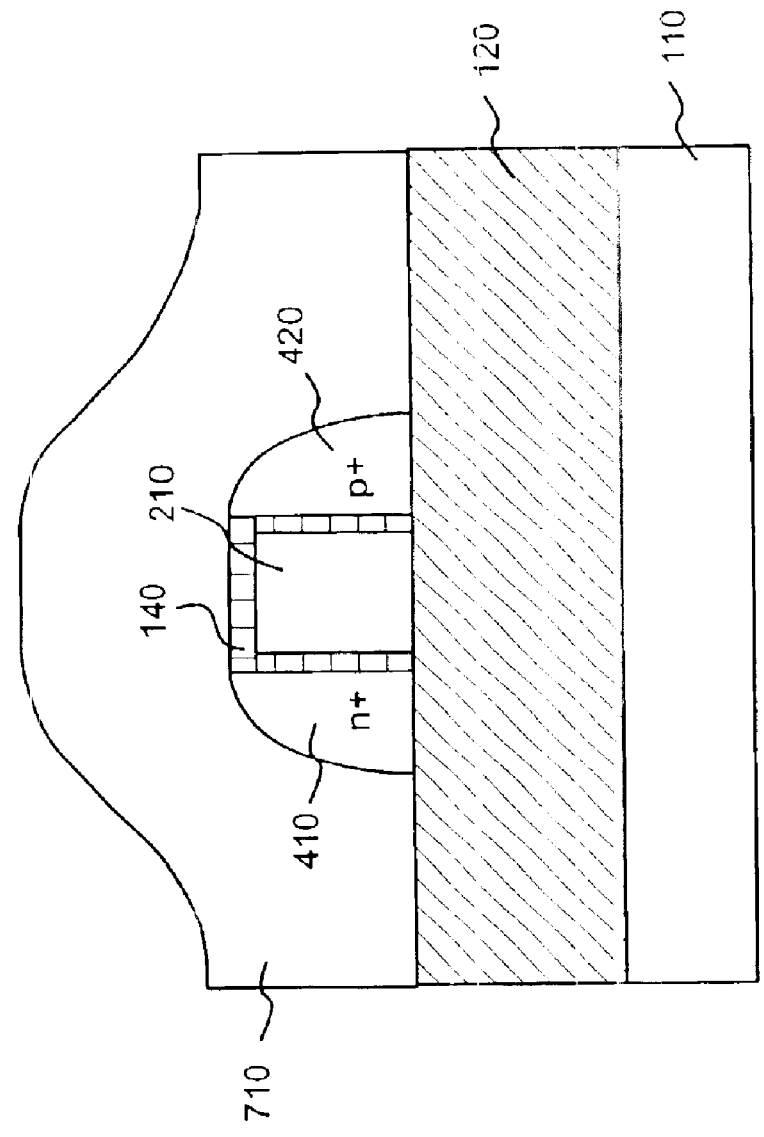
FIG. 7 is a cross-section illustrating the formation of a gate material on the device of FIG. 6 in accordance with an exemplary embodiment of the present invention.

A silicon layer 710 may then be deposited over semiconductor 100 in a conventional manner, as illustrated in FIG. 7. The silicon layer 710 may be used as gate material for the subsequently formed gate electrodes. In an exemplary implementation, the silicon layer 710 may include polysilicon deposited using conventional chemical vapor deposition (CVD) to a thickness ranging from about 500 Å to about 1000 Å. Alternatively, other semiconducting materials, such as germanium or combinations of silicon and germanium, or various metals may be used as the gate material.

Semiconductor device 100 may then be planarized. For example, a chemical-mechanical polishing (CMP) may be performed so that the gate material (i.e., silicon layer 710) is even with or nearly even with dielectric cap 140 in the vertical direction, as illustrated in FIG. 8. Referring to FIG. 8, silicon layer 710 (FIG. 7) now includes regions 810 and 820 effectively separated, both physically and electrically, by fin 210.

A metal, such as tungsten, cobalt, titanium, tantalum or molybdenum, may then be deposited, e.g., by sputter deposition, onto the silicon surfaces above regions 810 and 820. Alternatively, other metals may be used. A thermal annealing may then be performed to create a metal-silicide compound. According to an exemplary embodiment, the metal may be deposited to a desired thickness and the annealing performed at a temperature such that all or nearly all the silicon in regions 810 and 820 may react to form a silicide material in regions 910 and 920, as illustrated in FIG. 9A. That is, regions 910 and 920 may become fully silicided during the reaction between the silicon and the metal. The fully silicided gate material in regions 910 and 920 results in the subsequently formed gates experiencing no poly depletion effects. During the annealing, a portion of the n-type and p-type impurities from spacers 410 and 420, respectively, may diffuse into regions 910 and 920, respectively. The concentration of dopants in regions 910 and 920, however, may be higher at the respective areas close to fin 210.

Figure 9B:
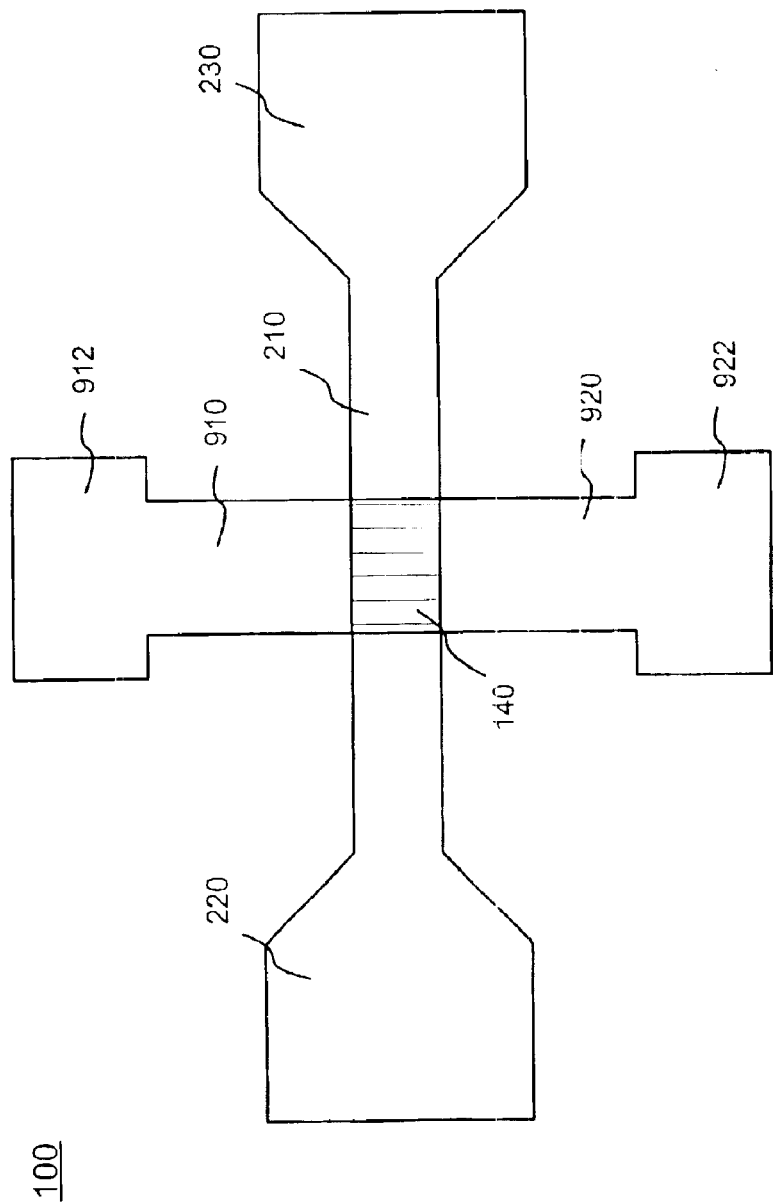
FIG. 9B is a top view illustrating an exemplary double-gate device formed in accordance with an exemplary embodiment of the present invention.

Regions 910 and 920 may then be patterned and etched to form the gates for semiconductor device 100. For example, FIG. 9B illustrates a top view of semiconductor device 100 consistent with the present invention after the gate electrodes are formed. As illustrated, semiconductor device 100 includes a double gate structure with gates 910 and 920 disposed on either side of fin 210. The gate dielectric 310 surrounding the side surfaces of fin 210 is not shown in FIG. 9B for simplicity. Gates 910 and 920 may include gate electrodes or contacts 912 and 922 formed at the respective ends of gates 910 and 920, as illustrated in FIG. 9B.

The source/drain regions 220 and 230 may then be doped. For example, n-type or p-type impurities may be implanted in source/drain regions 220 and 230. The particular implantation dosages and energies may be selected based on the particular end device requirements. One or ordinary skill in this art would be able to optimize the source/drain implantation process based on the circuit requirements and such steps are not disclosed herein in order not to unduly obscure the thrust of the present invention. In addition, sidewall spacers may optionally be formed prior to the source/drain ion implantation to control the location of the source/drain junctions based on the particular circuit requirements. Activation annealing may then be performed to activate the source/drain regions 220 and 230.

The resulting semiconductor device 100 illustrated in FIG. 9B is a double-gate device with a first gate 910 and a second gate 920. The gates are electrically and physically separated by fin 210. Each of the gates 910 and 920 may be separately biased when used in a circuit since they are effectively isolated or disconnected from each other by the fin 210. For example, gate 910 may be biased with a different voltage than gate 920 based on the particular circuit requirements. Independently biasing the gates increases the flexibility of semiconductor device 100 during circuit design.

In addition, since gates 910 and 920 are asymmetrically doped, i.e., gate 910 is doped with n-type impurities and gate 920 is doped with p-type impurities, gates 910 and 920 will have different work functions, $\Phi_1$ and $\Phi_2$, respectively. The work functions $\Phi_1$ and $\Phi_2$ may be adjusted independently of each other by varying the dopant concentrations during the implant processes described above with respect to FIGS. 5 and 6 based on the particular circuit requirements. In addition, by varying the dopant concentrations, the threshold voltage of the gates 910 and 920 may also be independently adjusted based on the particular circuit requirements. One of ordinary skill in the art would be able to optimize the dopant concentrations to achieve the desired work function and threshold voltage associated with gates 910 and 920, respectively.

Thus, in accordance with the present invention, a double-gate FinFET device is formed with electrically separated gates 910 and 920. The resulting structure exhibits good short channel behavior. In addition, gates 910 and 920 may be fully silicided so that no poly depletion effect occurs, thereby yielding better device performance. The gates 910 and 920 may also have different work functions and threshold voltages to provide increased flexibility. The present invention can also be easily integrated into conventional processing.

Other Embodiments

Figure 10A:
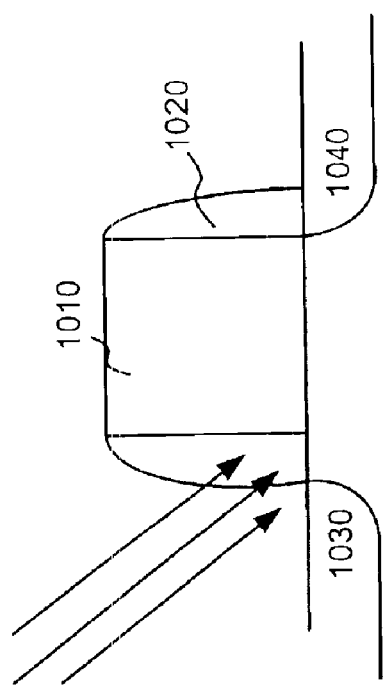
FIGS. 10A and 10B are cross-sections illustrating the formation of a halo structure in accordance with another embodiment of the present invention.

In other embodiments of the present invention, FinFETs with halo structures may be formed. For example, FIG. 10A illustrates a cross-sectional view of semiconductor device 1000 that includes gate 1010, sidewall spacers 1020 formed along the side surfaces of gate 1010, source region 1030 and drain region 1040. The semiconductor device 1000 may be a FinFET device. The fin in device 1000, however, is not shown for simplicity.

Figure 10B:
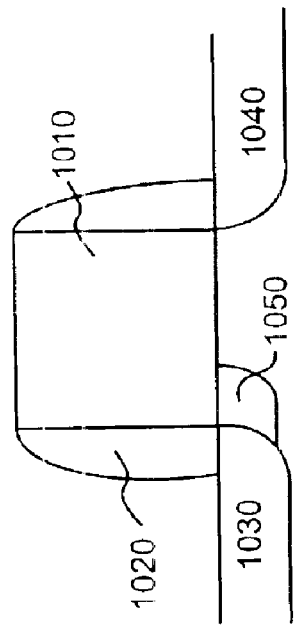

After the fin, gate 1010, sidewall spacers 1020 and source/drain regions 1030 and 1040 are formed, a tilt angle implant process may be performed to form a halo structure on the source side, as indicated by the arrows in FIG. 10A. For example, impurities may be implanted using a tilt angle implant process to form halo structure 1050, as illustrated in FIG. 10B. In this manner, the FinFET device 1000 may include a halo structure 1050 on the source side 1030, while the drain side 1040 includes no halo structure.

In another embodiment of the present invention, a FinFET may be formed with raised source/drain regions to reduce source/drain resistance. FIGS. 11A and 11B are cross-sections illustrating exemplary processing for forming a FinFET with raised source/drain regions. Referring to FIG. 11A, device 1100 includes a buried oxide (BOX) layer 1110 formed on a substrate, silicon layer 1120, gate 1130 and sidewall spacers 1140. These layers/structures may be formed in a conventional manner.

A source/drain implant may then be performed, as illustrated by the arrows in FIG. 11A. The source/drain implantation may include n-type or p-type impurities based on the particular circuit requirements. After the source/drain implantation has been completed, the silicon in silicon layer 1120 located adjacent the sidewall spacers 1140 may be grown, as illustrated at areas 1150 in FIG. 11B. The silicon in silicon layer 1120 may be grown via a selective epitaxial growth (SEG) process, via a thermal growth process, or some other process. After the silicon at areas 1150 has been grown to the desired thickness, the resulting semiconductor device 1100 experiences reduced source/drain resistance as compared to conventional devices.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of double-gate semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail. In addition, while a series of processes for forming the semiconductor device of FIG. 9B has been described, it should be understood that the order of the process steps may be varied in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used.

What is claimed is:

1. A semiconductor device, comprising:
   a substrate;
   an insulating layer formed on the substrate;
   a fin formed on the insulating layer;
   a first gate formed on the insulating layer and disposed on a first side of the fin, the first gate comprising a conductive material, wherein at least a portion of the first gate is doped with an n-type dopant, wherein a region of the first gate located near the fin has a higher concentration of the n-type dopant than an area located further away from the fin; and
   a second gate formed on the insulating layer and disposed on a second side of the fin opposite the first side, the second gate comprising a conductive material, wherein at least a portion of the second gate is doped with a p-type dopant, wherein a region of the second sate located near the fin has a higher concentration of the p-type dopant than an area located further away from the fin.

2. The semiconductor device of claim 1, wherein the doped portion of the first gate and the doped portion of the second gate are located near the fin.

3. The semiconductor device of claim 1, wherein the conductive material of both the first and second gates comprises a metal-silicide compound.

4. The semiconductor device of claim 3, wherein the first and second gates are both substantially fully silicided and are electrically separated from each other.

5. The semiconductor device of claim 1, wherein a concentration level of n-type dopant in the first gate is different than a concentration level of the p-type dopant in the second gate.

6. The semiconductor device of claim 1, further comprising:
   a gate dielectric formed on side surfaces of the fin; and
   a dielectric layer comprising at least one of a nitride and an oxide formed over a top surface of the fin.

7. The semiconductor device of claim 1, further comprising:
   a source region and a drain region formed above the insulating layer and adjacent a respective first and second end of the fin.

8. The semiconductor device of claim 1, wherein the insulating layer comprises a buried oxide layer and the fin comprises at least one of silicon and germanium.

9. A semiconductor device comprising:
   a substrate;
   an insulating layer formed on the substrate;
   a conductive fin formed on the insulating layer;
   a gate dielectric formed on first and second side surfaces of the conductive fin;
   a first gate formed on the insulating layer adjacent the gate dielectric formed on the first side surface of the fin, at least a portion of the first gate comprising an n-type doped conductive material; and
   a second gate formed on the insulating layer adjacent the gate dielectric formed on the second side surface of the fin, at least a portion of the second gate comprising a p-type doped conductive material, wherein a dopant concentration of the first and second respective gates is greater at an area close to the fin that an area further away from the fin.

10. The semiconductor device of claim 9, wherein the n-type doped conductive material in the first gate and the p-type conductive material in the second gate each comprise a metal-silicide compound, the first and second gates both being substantially fully silicided.

11. The semiconductor device of claim 9, wherein the first and second gates have different threshold voltages.

12. The semiconductor device of claim 9, wherein the first and second gates have different work functions.

* * * * *

UNITED STATES PATENT AND TRADEMARK OFFICE
CERTIFICATE OF CORRECTION

PATENT NO. : 6,853,020 B1
DATED : February 8, 2005
INVENTOR(S) : Yu et al.

It is certified that error appears in the above-identified patent and that said Letters Patent is hereby corrected as shown below:

<u>Column 8,</u>
Line 3, change the word "sate" to -- gate --.

Signed and Sealed this

Seventeenth Day of May, 2005

JON W. DUDAS
*Director of the United States Patent and Trademark Office*